(12) United States Patent
Schoeb

(10) Patent No.: US 10,468,277 B2
(45) Date of Patent: Nov. 5, 2019

(54) TREATMENT APPARATUS FOR TREATING A SURFACE OF A BODY

(75) Inventor: Reto Schoeb, Rudolfstetten (CH)

(73) Assignee: Levitronix GmbH, Zurich (CH)

( * ) Notice: Subject to any disclaimer, the term of this patent is extended or adjusted under 35 U.S.C. 154(b) by 1169 days.

(21) Appl. No.: 13/045,437

(22) Filed: Mar. 10, 2011

(65) Prior Publication Data

US 2011/0240220 A1 Oct. 6, 2011

(30) Foreign Application Priority Data

Mar. 31, 2010 (EP) ..................................... 10158604

(51) Int. Cl.
    *H01L 21/306* (2006.01)
    *B05C 13/02* (2006.01)
    *H01L 21/67* (2006.01)

(52) U.S. Cl.
    CPC ...... *H01L 21/6715* (2013.01); *H01L 21/6708* (2013.01); *H01L 21/67051* (2013.01)

(58) Field of Classification Search
    USPC ............ 156/345.18, 345.15, 345.24, 345.55, 156/345.12, 345.14; 118/52
    See application file for complete search history.

(56) References Cited

U.S. PATENT DOCUMENTS 6,559,567 B2 * 5/2003 Schob ........................ 310/90.5
6,810,888 B2 11/2004 Tsuchiya et al.

(Continued)

FOREIGN PATENT DOCUMENTS

EP    0 989 594 A2    3/2000
EP    1288511 A1    3/2003

(Continued)

OTHER PUBLICATIONS

Machine Generated English Translation of JP 2000-183010 published Jun. 30, 2000.*

(Continued)

*Primary Examiner* — Sylvia MacArthur
(74) *Attorney, Agent, or Firm* — Kilpatrick Townsend & Stockton LLP

(57) ABSTRACT

The invention relates to a treatment apparatus (1) for treating a surface (21) of a body (2) with a first treatment medium (31) and a second treatment medium (32). In this respect, the treatment apparatus (1) includes a holding device (5) rotatable about an axis of rotation (4) for receiving and holding the body (2) and a rotary drive (6) rotationally fixedly coupled to the rotatable holding device (5) as well as a supply device (7) for supplying the first treatment medium (31) and the second treatment medium (32) to the surface (21) of the body (2) held in the holding device (5). The treatment apparatus includes a collection container (8) having a separation element (80) which separation element (80) divides the collection container (8) into a first chamber (81) and into a second chamber (82) such that the first treatment medium (31) can be collected in the first chamber (81) and the second treatment medium (32) can be collected separately in the second chamber (82). In accordance with the invention, the collection container (8) includes a base chamber part (800) not movable with respect to the holding device (5) and the separation element (80) is movably arranged between a first position (A) and a second position (B) such that the first treatment medium (31) can be led off into the first chamber (81) in the first position (A) and the second treatment medium (32) can be led off into the second chamber (82) in the second position (B).

1 Claim, 8 Drawing Sheets

(56) References Cited

U.S. PATENT DOCUMENTS

Figure 1A:
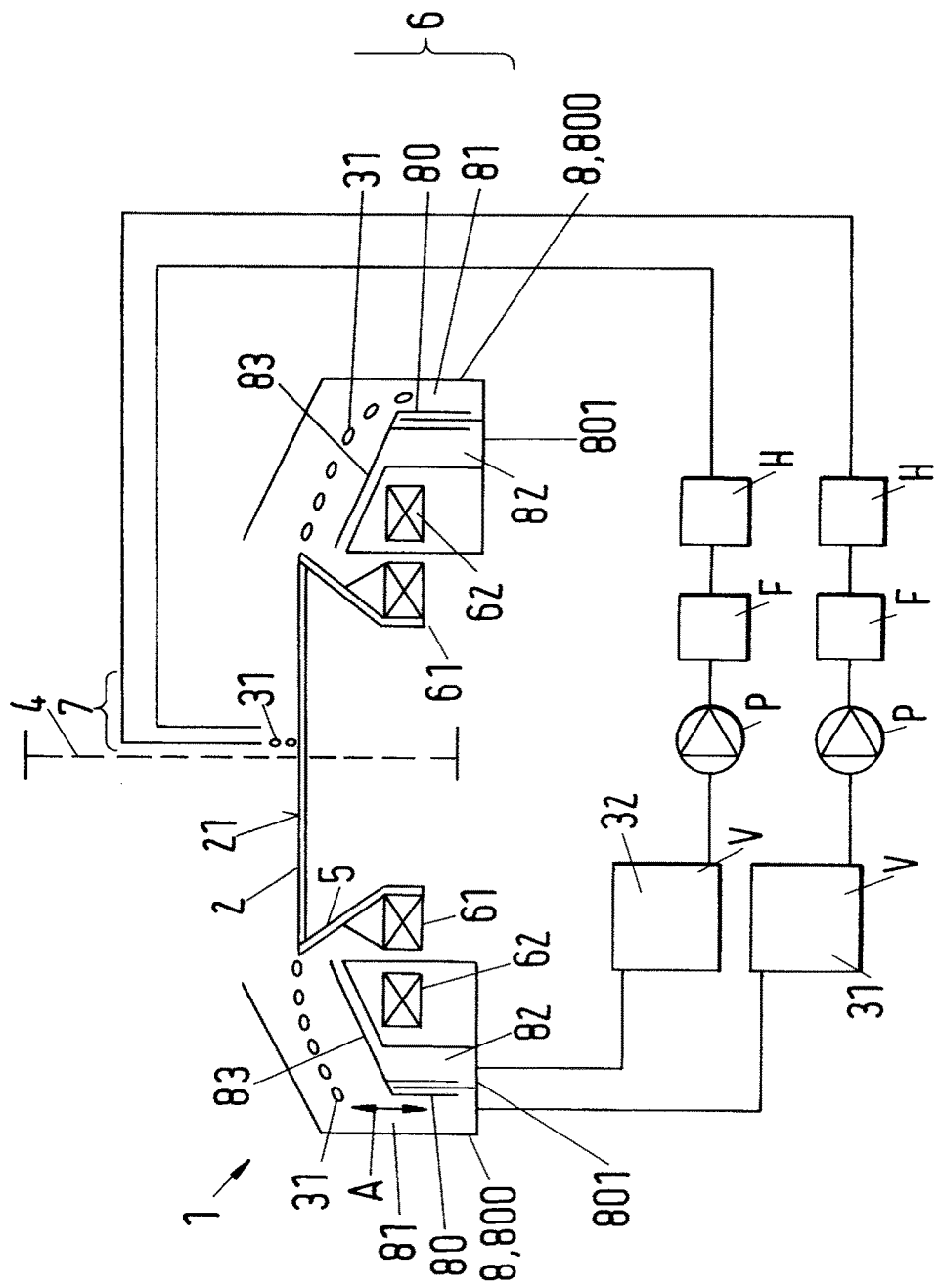

2004/0050491 A1  3/2004  Miya et al.
2009/0084409 A1  4/2009  Okura et al.
2011/0240220 A1* 10/2011  Schoeb .................... 156/345.14

FOREIGN PATENT DOCUMENTS

| EP | 0986162 A1 | 3/2009 |
| JP | 2000-183010 A | 6/2000 |
| WO | 9631934 A1 | 10/1996 |
| WO | WO 97/03225 A1 | 1/1997 |
| WO | 2009/132707 A1 | 5/2009 |

OTHER PUBLICATIONS

Machine Generated English Translation of the Abstract of EP 0989594 published Mar. 29, 2000.*
Machine Generated English Translation of EP 0989594. Published Mar. 29, 2000.*

* cited by examiner

TREATMENT APPARATUS FOR TREATING A SURFACE OF A BODY

CROSS REFERENCE TO RELATED APPLICATIONS

This application claims the priority of European Application No. 10 158 604.8, filed on Mar. 31, 2010, the disclosure of which is incorporated herein by reference.

The invention relates to a treatment apparatus for treating a surface of a body, in particular for treating a wafer in accordance with the preamble of independent claim 1.

There is a need in a number of industrial processes, for example in the manufacture of semiconductors and chips, to provide specific surfaces of substrates, for example wafers, for the manufacture of electronic components with suspensions in a controlled manner to process their surfaces. Chemical-mechanical planarization processes (CMP, cleaning and/or corroding of wafers or the removal of photoresist to be removed using solvents, also called polymer removal) are named as important examples here such as are used in the semiconductor industry. In such processes, a suspension, usually called a slurry, of typically very fine solid particles and a liquid is applied to a rotating wafer and there serves for the polishing or lapping of the very fine semiconductor structures. Another example is the application of photoresist to the wafer or the roughening of surfaces of computer hard disks to prevent an adhesion of the writing/reading heads by adhesion forces, that is, for example, by Vsn der Waals forces.

The surfaces must very frequently be processed with different liquids in a plurality of sequential worksteps. In the case of wafers for semiconductor manufacture, they are, for example, mounted in the form of very thin disks in a process chamber on a rotatable holder which is driven via a rotary axle by an electric motor which is located outside the process chamber. The thin wafer is set into a very fast rotation in this manner and its surface has different treatment media, liquid treatment media as a rule, applied to it successively.

It is common to all these worksteps that a specific quantity of the corresponding treatment medium is applied to the rotating wafer from a suitable supply device, for example from a nozzle. The liquid is then transported away completely or, as in the coating of the wafer, at least partly, to the outside beyond the margin of the wafer, due to the centrifugal force so that the excess treatment medium can be led off to the outside from the treatment chamber.

Since the treatment media are very expensive as a rule, it is endeavored to collect the different treatment media used successively as separately as possible, to reprocess them where possible and then to recirculate them into the treatment process for reuse. In this respect, it is then also endeavored, for environmental protection reasons alone, to collect the used media separately in the treatment chamber if they cannot be used again.

Such an apparatus is described, for example, in U.S. Pat. No. 6,810,888 B2.

The aforesaid apparatus in accordance with U.S. Pat. No. 6,810,888 B2 in this respect substantially includes a rotatable holder for holding a wafer as well as a nozzle arrangement which is provided above the wafer and with which different liquids for the processing and treatment of the surface of the wafer can be applied to the surface of the wafer successively from different nozzles. A system made up of a plurality of concentrically arranged ring chambers is provided around the holder for the wafer for the separate collection of the liquids applied successively to the wafer in the treatment process. Each ring chamber in this respect has a frustoconically designed run-off cone which is inclined in a manner dropping toward the ring chamber and in a diverging manner so that, when the inner margin of the run-off once is approximately at the level of the rotating wafer, the liquid moves over the outer margin of the wafer onto the run-off cone and over the run-off cone into the provided ring chamber. The different liquids are thus successively collected separately in the different concentric chambers and can subsequently also be led off separately via outflow lines from the different chambers to the outside for reuse or for disposal.

To be able to supply the liquids to the different concentrically arranged chambers successively, the run-off cones of the different ring chambers are differently designed and the different ring chambers are separately displaceable in a vertical direction such that each run-off cone of each ring chamber can be successively placed with respect to the wafer by a suitable control of the vertical positions of the ring chambers such that the just used treatment liquid can be led off into the provided ring chamber.

The holder for the wafer, the nozzle arrangement for the supply of the treatment liquids and the system of the ring chambers are accommodated in a hermetically closed process chamber so that the treatment of the wafers can also be carried out, for example, under a presettable gas atmosphere, for example under a specific process pressure or under an inert gas atmosphere, for example to suppress oxidation processes on the surface of the wafer. Damaging, e.g. corrosive or toxic liquids are also commonly used so that the corresponding treatment steps can only be carried out in a closed environment for environmental and safety reasons.

The ring chambers in which the liquids are collected are provided with flexible outflow lines which make a vertical movement of the ring chambers possible at all and via which the collected liquid can be supplied from the process chamber to a recycling system, for example. The motor for the drive of the wafer holder is also located outside the process chamber for obvious reasons. Indeed simply to prevent a contamination of the interior of the process chamber by the motor, but also because the process chamber should be kept as small as possible for different reasons well-known to the skilled person. The holder for the wafers is therefore set into rotation via a rotary axle by the outwardly disposed motor.

The problem of the separate collection of the different treatment media used is thus admittedly solved by the apparatus in accordance with U.S. Pat. No. 6,810,888 B2 in principle. However, such apparatus have some considerable disadvantages.

An important disadvantage of these treatment apparatus known from the prior art is that all the ring chambers have to be moved to and fro in a vertical direction to collect the different treatment materials used successively separately. It is here a complicated mechanical system of concentric chambers, which alone already have a considerable weight together with the liquids collected therein, which has to be moved in a cumbersome manner by a vertically acting drive mechanism. The chambers which are concentrically disposed in one another furthermore have to be guided very precisely in one another and have to have a corresponding guide mechanism since it is otherwise possible that the concentric ring chambers wedge into one another on their relative vertical movement, which naturally also occurs and results in the standstill of the plant. The total plant must then be switched off to remedy such problems since the process chamber has to be opened. The negative consequences of such a stop are obvious. Due to the guide mechanism for realizing a reliable vertical movement of the total ring chamber system, the ring chamber system with the guide mechanism and the vertical drive mechanism is relatively large overall, which is contrary to the demand for a process chamber volume which is as small as possible.

Since the ring chambers are displaceable in total in the vertical direction, as already mentioned, the outflow lines must be made as flexible lines. The flexible outflow lines are accordingly under a strong mechanical load due to the constant vertical movement to and fro of the ring chambers. The flexible outflow lines must therefore be made from expensive, highly loadable material since a bursting of the outflow lines in the interior of the process chamber has to be prevented under all circumstances. Particularly the outflow lines have to be monitored and serviced correspondingly often, which is in turn associated with a corresponding effort and/or cost.

Further serious disadvantages are due to the drive system. Since the drive motor, as described above, has to be provided outside the process chamber, the drive of the wafer holder takes place via a drive axle which has to be sealingly journalled in a leadthrough in the base of the process chamber. Such seals generally have the problem that they always give off at least small quantities of abrasive or very fine quantities of lubricant and thus also give them off into the process chamber. Since this has to be prevented at all costs, the corresponding leadthroughs for the drive axle not only have to be extremely gastight, but also encapsulated in a correspondingly complex and/or expensive manner. Since a contamination of the chamber interior cannot be completely prevented even with the largest technical effort, the process chamber is frequently exposed to an overpressure of a process gas so that the process gas urges the contaminants to the outside via the seals and thereby does not allow them to penetrate into the process chamber. This is naturally associated with a high effort and/or expense simply to provide the process gas under the required overpressure. On the other hand, there are processes which preferably have to be carried out at an underpressure. Such processes can then not be carried out using a plant in accordance with U.S. Pat. No. 6,810,888 B2 since the process chamber would be contaminated via the leadthrough of the drive axle from the outside and by abrasive or lubricant from the seal if it is operated at an underpressure with respect to a pressure present outside the process chamber.

Apparatus in accordance with U.S. Pat. No. 6,810,888 B2 are generally also not usable for cases in which the wafer should rather be installed suspended beneath the holder for processing for technical process reasons or for other reasons, for example, since the drive axle naturally does not allow such an arrangement of the wafer at the holder for purely geometrical reasons. The wafer must generally be installed lying, at the top at the holder on the side disposed opposite the drive axles in the process chamber.

A further disadvantage is that the arrangement demands a lot of space with regard to the axial direction. This is a disadvantage, in particular when apparatus should be operated, for example in a clean room, which should be kept as small as possible for known advantageous reasons, especially naturally also because a corresponding surrounding atmosphere has to be maintained which requires a correspondingly elaborate design from an apparatus aspect having exhaust systems, filter means, pumps possible means for creating a protective gas atmosphere in the clean room and so forth. The larger the clean room is the more elaborate the aforementioned means for the operation of the clean room have to be designed and the more elaborate and expensive the corresponding operation of the clean room also becomes.

Starting from the prior at, it is therefore an object of the invention to propose a treatment apparatus for treating a surface of a body with at least two different treatment media, in particular for treating a disk-shaped wafer which allows the different treatment media used to be collected separately and specifically to be resupplied to the treatment process for reuse. In this respect, problems with the ring chambers movable in the vertical direction known from the prior art should be avoided. The treatment apparatus should be flexible and simple in use, and in particular permit a simple and reliable exchange, automated where possible, of the bodies to be treated.

The problems known from the prior art with the lead-throughs of the drive motors should also be solved by the invention by specific embodiments so that a hermetic sealing of the treatment chamber is possible in a simpler and safer manner and the body to be treated should be able to be installed either beneath or above a rotatable holder. Furthermore, the treatment apparatus should be carried out as space saving as possible so that this takes up as little space as possible.

The subjects of the invention satisfying these objects are characterized by the features of independent claim 1.

The dependent claims relate to particularly advantageous embodiments of the invention.

The invention relates to a treatment apparatus for treating a surface of a body with a first treatment medium and a second treatment medium. in this respect, the treatment apparatus includes a holding device rotatable about an axis of rotation for receiving and holding the body and a rotary drive rotationally fixedly coupled to the rotatable holding device as well as a supply device for supplying the first treatment medium and the second treatment medium to the surface of the body held in the holding device. The treatment apparatus includes a collection container having a separation element, which separation element divides the collection container into a first chamber and into a second chamber such that the first treatment medium can be collected in the first chamber and the second treatment medium separately in the second chamber. In accordance with the invention, the collection container includes a base chamber part not movable with respect to the holding device and the separation element is movably arranged between a first position and a second position such that the first treatment medium can be led off into the first chamber in the first position and the second treatment medium can be led off into the second chamber in the second position.

It is thus essential to the invention that the collection container, specifically made as a ring chamber, has a base chamber part which is not displaceable with respect to the holding device. The collection container of the present invention is thus not a collection container composed of a plurality of concentric ring chambers as is known from the above-described prior art, but the collection container of the present invention is rather a fixed, non-displaceable collection container which includes a plurality of chambers for the separate collection of the different treatment media. It is not the ring chamber in total which is movable here, but rather only the one separation element or the plurality of separation elements present, wherein the separation element is arranged movable between a first position and a second position such that the first treatment medium can be led off into the first chamber in the first position and the second treatment medium can be led off into the second chamber in the second position.

A plurality of serious disadvantages of the apparatus known from the prior art are thereby remedied at the same time. Since the collection container is a single, integral collection container which is no longer formed from a plurality of concentric ring chambers which are movable with respect to one another and which each singly have to be moved to and fro in the vertical direction to be able to collect the different treatment media used successively separately, all complicated mechanisms can be dispensed with. The collection container in accordance with the invention does not have to be moved together with the liquid collected therein. Instead, only the much lighter separation elements, which are much easier to guide, have to be moved which moreover do not have to be guided directly with respect to one another like the concentric ring spaces in the prior art. The demands on the precision of the vertical guide mechanism are thereby a lot smaller, the structure is less complex and thus less expensive, less prone to disturbances and less maintenance-intensive than the complicated structure with vertically movable concentric ring spaces.

Since the collection container in accordance with the invention, unlike the ring chambers in the prior art, are not displaceable in total in the vertical direction, but rather have a fixed vertical position, no problematic flexible output lines with the initially described problems have to be used either. Relatively inexpensive and robust, non-flexible lines, for example, lines made from suitable metals or suitable plastics can rather be used as the drain lines for leading off the treatment media from the chambers.

As will be described in more detail further below, the invention develops further very substantial advantages if, in a specific embodiment, instead of a conventional drive such as in already described in principle e.g. in U.S. Pat. No. 6,810,888 B2, a bearingless motor is used which is, however, not compulsory for the present invention.

In practice, the non-displaceable base chamber part will include a chamber bottom through which the first treatment medium and the second treatment medium can be led from the collection container, can preferably be led off via rigid outflow lines.

The separation element can in this respect in principle be displaced by any suitable mechanism between the first position and the second position. In a first embodiment, the separation element is movable by means of a connecting rod between the first position and the second position. The connecting rod can in this respect be moved in a manner known per se, for example by means of a linear motor, by means of a hydraulic or pneumatic piston, via a gear or any in any other suitable manner by a drive between the first position and the second position.

In another embodiment, the separation element can be made movable by means of a spindle between the first position and the second position. The separation element can thus, for example, have an internal thread into which a threaded bar engages so that the separation element is displaceable between the first position and the second position by rotation of the threaded bar.

A stretchable bellows is preferably provided at the separation element so that the separation element is movable between the first position and the second position by means of the stretchable bellows. For this purpose, the stretchable bellows can have a pressurized fluid, for example air or oil, applied to it in a manner known per se to generate a movement in a first direction. The opposite movement can then be generated, for example, in that the bellows is made so that it is under an elastic fore in the opposite direction so that on the relief of pressure the movement in the opposite direction is automatically generated.

The separation element itself can naturally also be formed from a flexible wall in a presettable region or can include a flexible section so that a movement can be generated between the first position and the second position by stretching or compressing the flexible wall or the flexible section.

In an embodiment particularly important for practice, the rotatable holding device is provided in a process chamber which is preferably a hermetically closable process chamber and can, for example, have a process gas and/or a presettable process pressure applied to it.

Very particularly preferably, the rotary drive itself, that is the motor for driving the holding device, is provided within the process chamber.

As already mentioned further above, the rotary drive in an embodiment particularly important for practice is a magnetically journalled motor, in particular a bearingless motor, including a stator and a rotor contactlessly magnetically journalled with respect to the stator. In this respect, the rotor of the rotary drive advantageously simultaneously forms the holding device. In this respect, the rotor is in practice frequently made as a more or less narrow ring and the rotor can advantageously be permanently magnetic. In this respect, the stator is particularly preferably provided outside the process chamber, whereby space can substantially be saved in the process chamber, on the one hand. On the other hand, the rotatingly driving part of the rotary drive, namely the rotor of the rotary drive, lies completely in the interior of the process chamber, whereas all the other parts of the rotary drive, in particular the stator with all the necessary electrical connections and control devices, lie outside the process chamber without a mechanical connection or an electrical line connection being necessary between the driving rotor and the part of the rotary drive lying outside the process chamber.

In this specific embodiment, the invention develops further substantial advantages.

Since the actual rotary drive, namely the rotor of the bearingless motor, lies completely within the process chamber and, apart from the magnetic drive field generated by the stator, no physical connection is necessary from the rotor to outside the process chamber, a leadthrough in the bottom of the process chamber, in which a drive axle has to be sealingly journalled, is also no longer necessary. The bearingless motor of the present invention, which is known as such per se to the skilled person, namely manages completely without a drive axle. The above-described problems with the seals or with abrasive or the giving off of very fine quantities of lubricant from the bearing can thus not occur at all since bearings are no longer necessary. The process chamber can thus be hermetically closed in a simple manner in the operating state. A contamination of the chamber interior can thus be practically completely prevented without any larger technical effort. The process chamber therefore also no longer necessarily has to be exposed to an overpressure of a process gas. Processes which preferably have to be carried out under an underpressure can also be carried out without problems in a treatment apparatus in accordance with the invention since leaking leadthroughs through which gas could penetrate from the outside into the process chamber are no longer present.

In particular, then when an especially space saving compact design is required the stator can also be arranged within the process chamber. Advantageously the stator is then arranged within the moveable separation elements. For protection of the stator against the treatment media which can, for example be physically or chemically aggressive substances, such as acids, alkaline solutions or also abrasively acting media, or media which are present at an increased temperature, the stator is advantageously encapsulated, preferably completely encapsulated, for example with PTFE, Teflon, PVC, stainless steel, or any other protective material. When the stator of the bearingless engine is arranged within the process chamber this automatically has several advantages. On the one hand, the air gap between the rotor and the stator can be minimized, whereby an effective electromagnetic coupling between the rotor and the stator can be achieved.

A further important advantage is that such a stator arranged in the interior of the process chamber takes up comparatively little space with regard to the axial direction. This means the drive motor is extraordinarily flat and a plurality of process chambers can be readily stacked on top of each other in a very compact manner, as the drive motor has no components which project beyond the process chamber in the axial direction. The drive motor also does not take up additional space beyond the process chamber in the radial direction, as it is arranged completely within the process chamber with all components. This is of particularly beneficial advantage when the treatment apparatus in accordance with the invention should, for example, be operated in a clean room which should advantageously be kept as small as possible as already mentioned. By making use of a treatment device in accordance with the invention having a stator arranged within, without a problem a plurality of different process chambers can simultaneously be arranged within a clean room and can, for example be stacked, with the demand of space for the installation of the process chambers being reduced within the clean room. These previously described advantages are only fully possible with a bearingless motor in accordance with the present invention, whose stator is arranged within the process chamber.

In practice, a treatment apparatus in accordance with the invention will frequently be used for treating a disk, in particular a wafer, for manufacturing microelectronic components. Examples of treatment processes important for practice are named here as representatives for further possible processes: chemical-mechanical planarization (CMP), the cleaning and/or corroding of wafers or the removal of photoresist with solvents, also called polymer removal, such as are e.g. mainly, but not only, used in the semiconductor industry.

If a bearingless motor is used as the drive, the wafer can, for example, alternatively also be installed suspended beneath the holder for processing since a disturbing drive axle is no longer present. The wafer thus generally no longer has to be installed lying, at the top at the holder on the side disposed opposite the drive axle in the process chamber.

In industrial practice, a treatment apparatus of the present invention will include a manipulator, in particular a program controlled robot unit, for automatically changing the body, wherein a plurality of individual treatment chambers is preferably provided, wherein advantageously one single manipulator and only some few manipulators are provided to place the wafers automatically and in a program controlled manner into the treatment apparatus or to remove them from them.

Figure 1B:
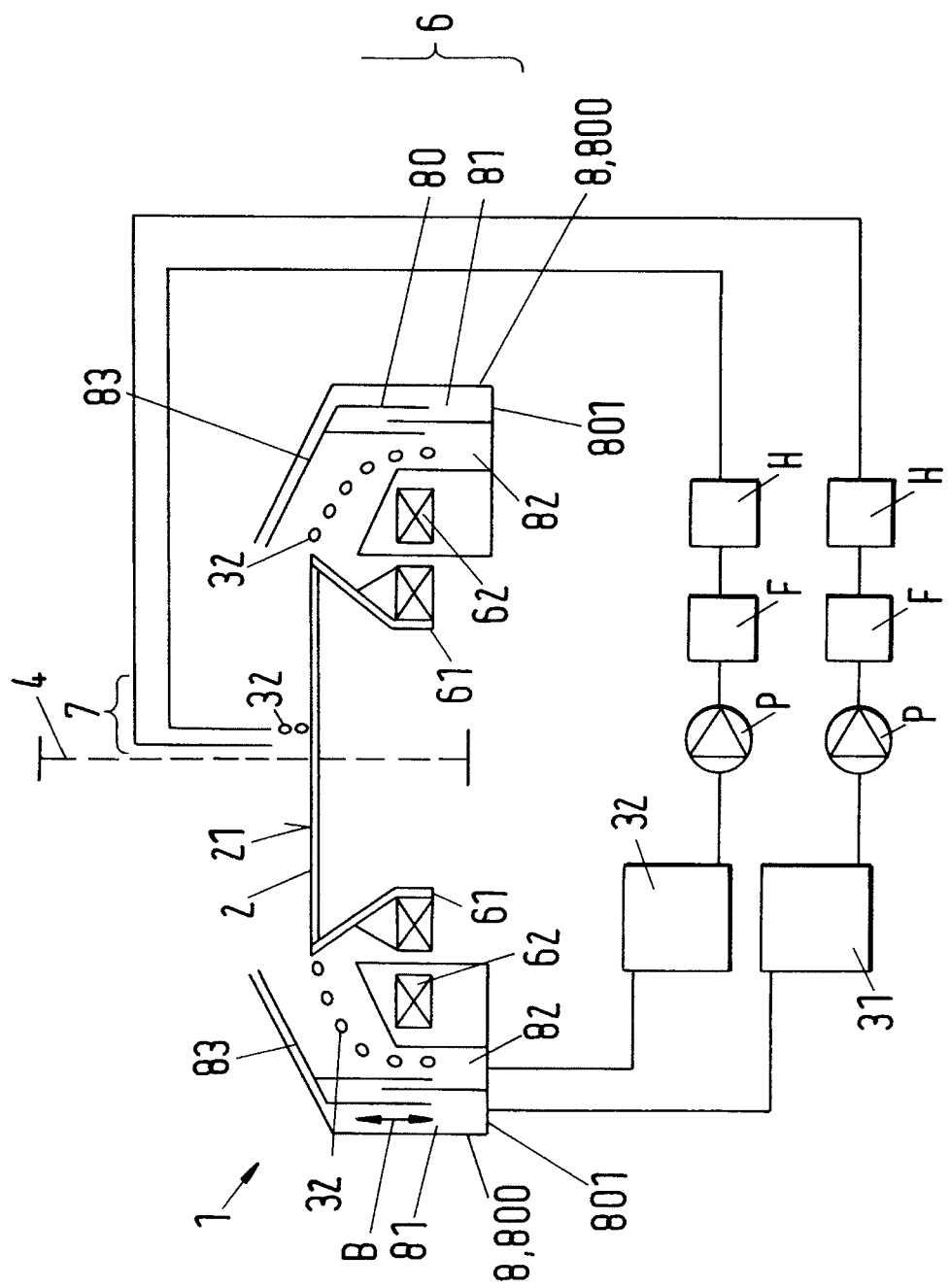
Figure 2:
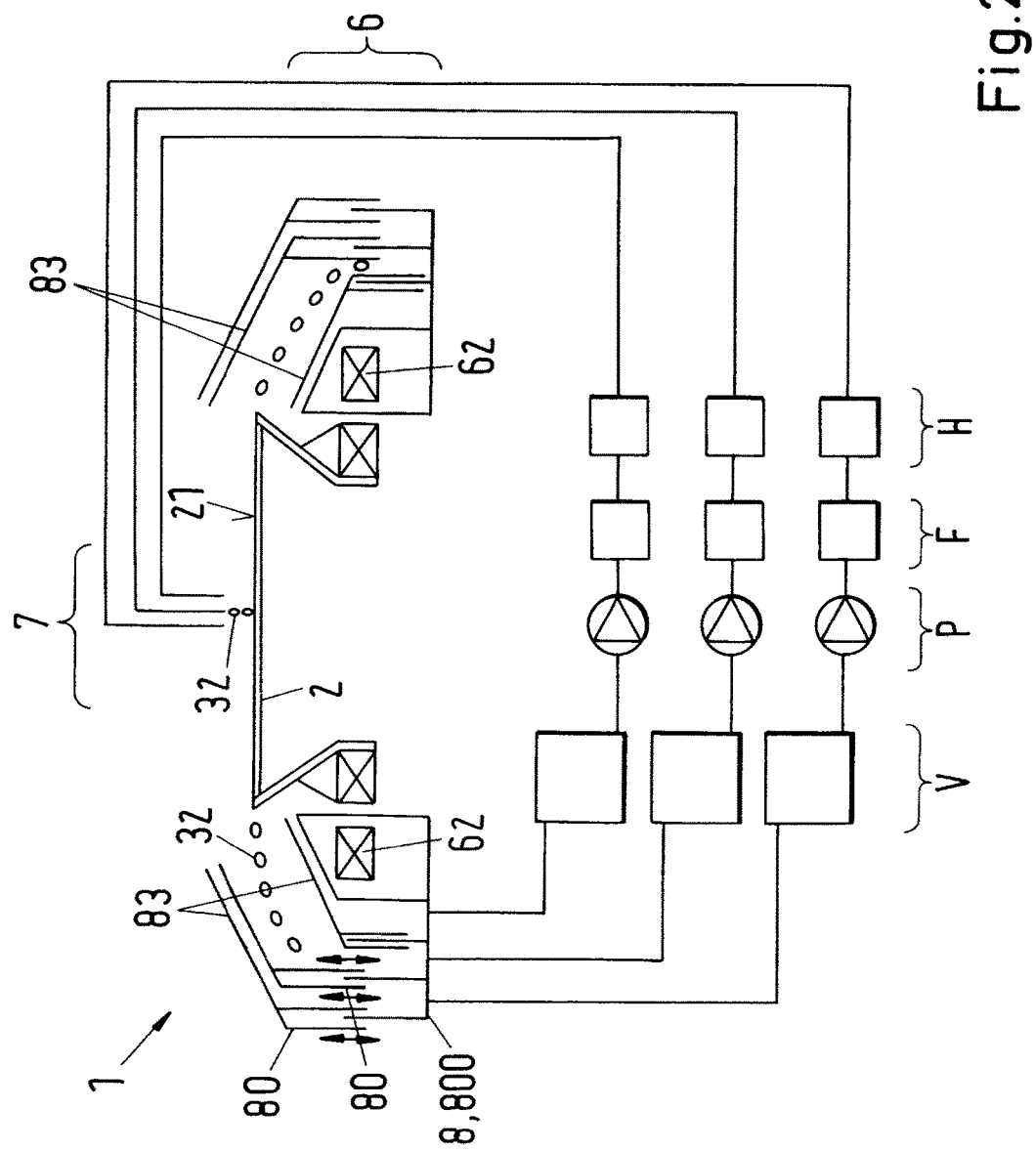
Figure 2A:
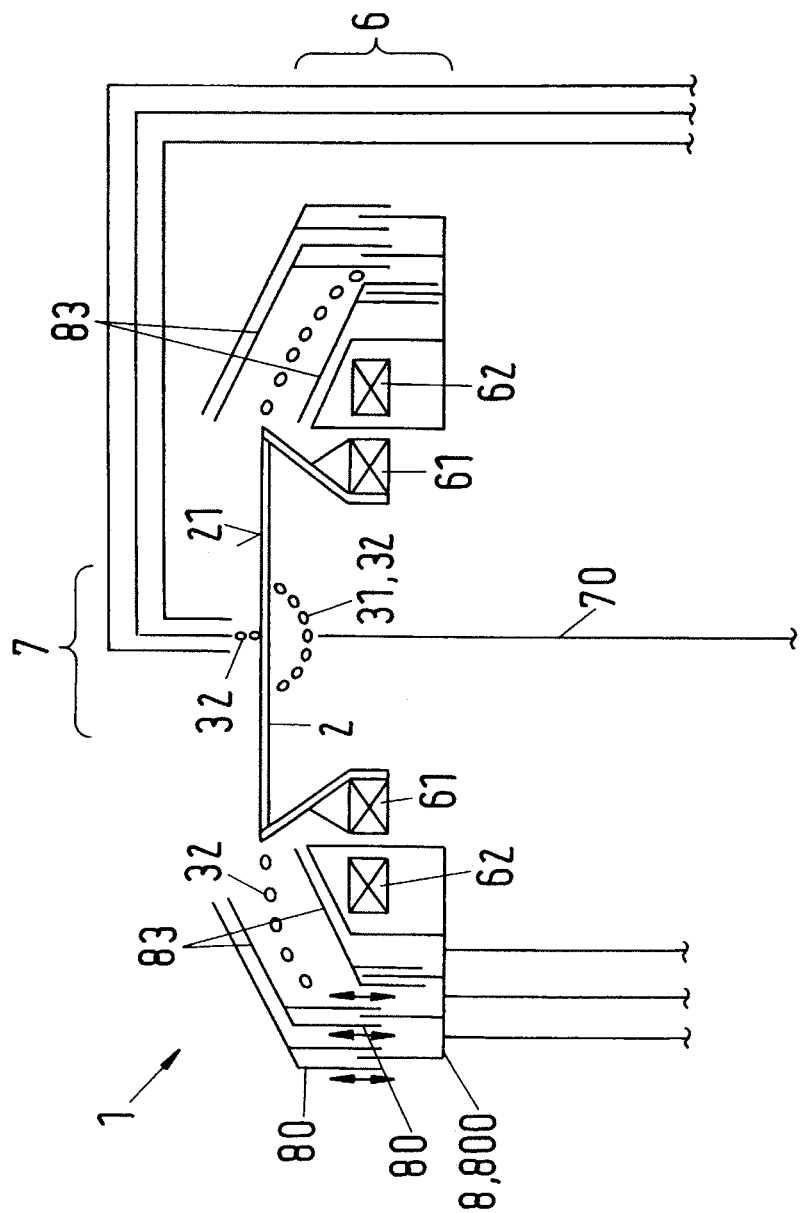
Figure 3A:
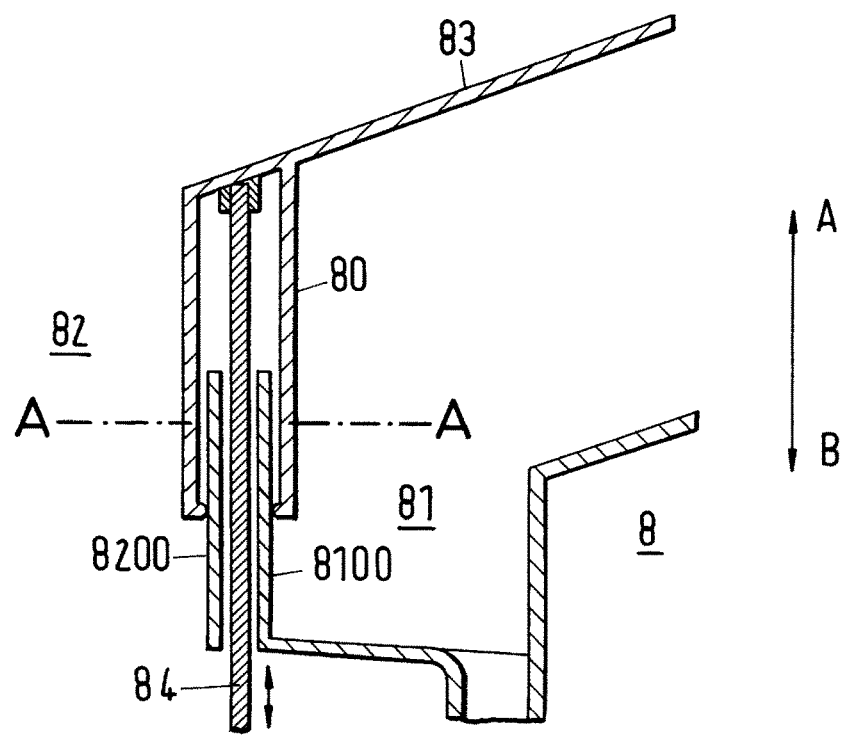
Figure 3B:
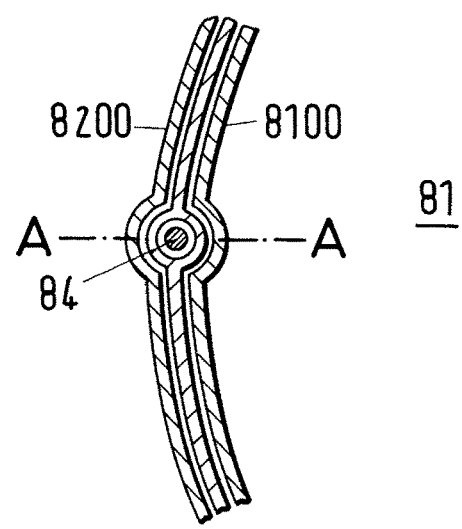
Figure 4:
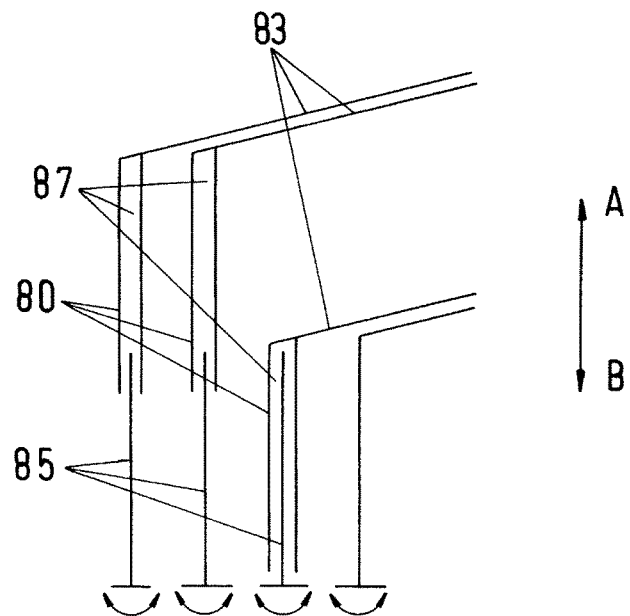
Figure 5:
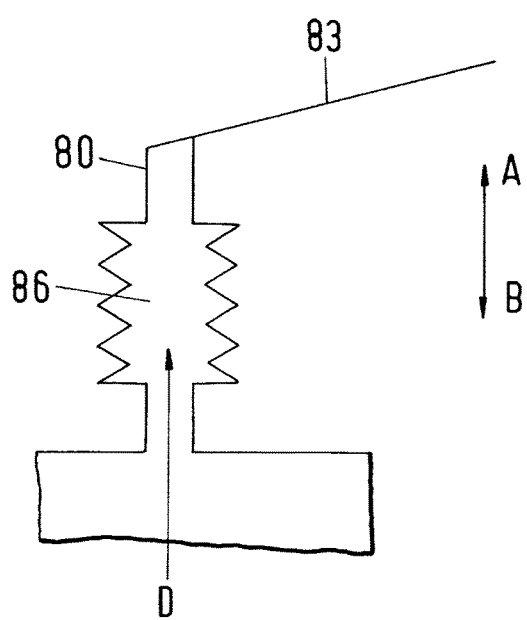

The invention will be explained in more detail in the following with reference to the drawing. There are shown in a schematic representation:

FIG. 1a a first embodiment with a bearingless motor with an outflow of the first treatment medium into the first chamber;

FIG. 1b the embodiment in accordance with FIG. 1a with an outflow of the second treatment medium into the second chamber;

FIG. 2 a second embodiment with three chambers;

FIG. 2a a further embodiment in accordance with FIG. 2a with a two-side medium application;

FIG. 3a a separation element driven by means of a linear motor;

FIG. 3b a section in accordance with FIG. 3a along the line A-A;

FIG. 4 a separation element driver by means of a spindle;

FIG. 5 a separation element drive by means of bellows;

FIGS. 6a-6d a processing sequence with a wafer installed in a lying position;

FIGS. 7a-7d a processing sequence with a wafer installed suspended.

Before the essential aspects of the invention is looked at in more detail in the following with reference to specific embodiments, the function of the bearingless motor should first be briefly explained as it is shown by way of example and schematically in the following Figures.

Within the framework of this application, a bearingless motor is to be understood as a motor which forms an electromagnetic rotary drive and which includes a magnetic rotor, preferably a permanent magnetically excited rotor, and a stator, wherein the rotor is journalled in a contactless manner by means of magnetic forces. The characteristic which gives the bearingless motor its name is that is does not have any separate magnetic bearing for the rotor. For this purpose, the stator is designed as a bearing stator and drive stator and the rotor as a passively magnetic rotor which serves both as a bearing rotor and as a drive rotor. The stator is designed or is provided with electric windings such that it generates an electromagnetic rotary field which, on the one hand, exerts a torque onto the rotor which drives its rotation about the axis of rotation and which, on the other hand, exerts a transverse force which can be set as desired onto the rotor so that its radial position with respect to a plane perpendicular to the axis of rotation can be preset or actively controlled. In the operating state, the rotor is thus actively controllable or drivable by means of the electric windings of the stator with respect to three degrees of freedom, namely the rotation about the axis of rotation and the radial position in the plane perpendicular to the axis of rotation (two degrees of freedom).

With respect to three further degrees of freedom, namely tilts with respect to the plane perpendicular to the axis of rotation (two degrees of freedom) and the axial position, the rotor is passively magnetic in the bearingless motors known from the prior art, that is it is stabilized by reluctance forces in a non-controllable manner. The rotor is thus both drivable and journallable in a contactless manner in the operating state by the magnetic interaction between the bearing/drive stator and the rotor without separate magnetic bearings being present for this purpose.

The term "bearingless motor with magnetic rotor" is to be understood in this sense within the framework of this application. With respect to further details of the embodiment and of the control or regulation of the bearingless motor, reference is made here e.g. to EP 0 986 162 or to WO-A-96/31934 in which such a bearingless motor is disclosed for the example of a rotary pump. Reference is in particular also made in this connection to WO 2009/132707 A1 which discloses a bearingless motor with a ring rotor such as can preferably be used in the present invention. in this respect the rotor can inter alia be made in the form of a compact disk or also as a ring, that is with a cut-out at the center. A rotor made as a ring is also particularly preferably used in the present invention. In particular with large rotors, the embodiment of the rotor as a ring above all has the advantage, in addition to its specific magnetic properties, that such an annular rotor naturally has much less weight than a disk-shaped rotor with the same outer dimensions because a substantial quantity of material is saved by the cut-out at the center of the rotor in the annular rotor. In another respect, it is also possible on the use of an annular rotor to apply a treatment medium to the body supported by the annular rotor, specifically a wafer, for manufacturing microelectronic components, successively or simultaneously from both sides, such as is shown schematically, for example, in FIG. 2a with respect to a special embodiment.

FIGS. 1a and 1b show in a schematic representation a first embodiment of a treatment apparatus 1 in accordance with the invention having a bearingless motor 6. In this respect, FIG. 1a differs from FIG. 1b only in that in accordance with FIG. 1a the first treatment medium 32 is led into the first chamber 81 in a first workstep, whereas in FIG. 1b the first method step is already concluded and a second method step is shown in which an outflow of the second treatment medium 32 into the second chamber 82 is just being shown.

The specific embodiment of a treatment apparatus 1 in accordance with the invention for treating a surface 21 of a body 2 with a first treatment medium 31 and a second treatment medium 32 includes a holding device 5 rotatable about an axis of rotation 4 for receiving and holding the body 2 which in the present example is a wafer 2 for manufacturing microelectronic components. The treatment device 1 further includes a rotor 61 of the rotary drive 6, said rotor being rotationally fixedly coupled to the rotatable holding device 5, as well as a supply device 7 which is made in the form of a nozzle pair 7 in the embodiment of FIG. 1a and FIG. 1b, and which is provided for supplying the first treatment medium 31 and the second treatment medium 32 to the surface 21 of the body 2 held in the holding device 5. In this respect, the treatment apparatus 1 further includes a collection container 8 with a separation element 80 at which a respective run-out cone 83 is provided. The separation element 80 with the run-out cone 83 divides the collection container 8 into a first chamber 81 and into a second chamber 82 such that the first treatment medium 31 can be collected in the first chamber 81 and the second treatment medium 32 can be collected separately in the second chamber 82.

The treatment apparatus 1 in this respect includes in a manner known per se a process chamber in which at least the rotor 61 of the bearingless motor with the wafer 2, the supply device 7 and the collection container 8 are accommodated, whereas the stator 62 is preferably arranged, as shown in the Figures, outside the process chamber. For reasons of clarity, the explicit representation of the process chamber was omitted in the Figures.

In this respect, the run-out cones 83 at the separation element 80 are admittedly advantageous, but not absolutely necessary. If, for example, the wafer is rotated at a very high speed, it is also possible that the liquid 31, 32 hurled away from the wafer is generally hurled up to the separation element 80 furthest away and therefore automatically lands in the correct chamber 81, 82 even without a run-out cone 83 if only the height of the separation elements 80 is suitably selected.

In accordance with the invention, the collection container 8 includes a base chamber part 800 not displaceable with respect to the holding device 5 and having a chamber bottom 801, and the separation element 80 with the run-out cone 83 is arranged movable between a first position A and a second position B such that A in accordance with FIG. 1a the first treatment medium 31 can be led off into the first chamber 81 in the first position and B in accordance with FIG. 1b the second treatment medium 32 can be led off into the second chamber 82 in the second position.

To be able to supply the treatment media 31, 32 to the two concentrically arranged chambers 81, 82 after one another, the run-out cones 83 of the different separation elements 80 are designed differently and the separation elements 80 are separately displaceable in the vertical direction along the axis of rotation 4 in accordance with the representation such that each run-out cone 83 of each camera 81, 82 can be placed by a suitable control of the vertical positions of the separation elements 80 after one another with respect to the wafer such that the just used treatment medium 31, 32 can be led off into the provided chamber 81, 82.

So that the treatment media 31, 32, which are often very expensive, can be reused, the chambers 81, 82 are connected via lines to a recycling plant which is made up of two collection tanks V in which the first treatment medium 31 and the second treatment medium 32 are collected separately, are supplied from there in each case to a pump P which supplied the two treatment media 31, 32, separately in each case, to a filter F and to a heater H from where the treatment media 31, 32 processed in this manner again are supplied for reuse to the supply line 7 again.

It is self-explanatory in this respect that the invention is not restricted to treatment apparatus 1 with which only two different treatment media 31, 32 can be separately collected. A second embodiment in accordance with FIG. 1a and FIG. 1b respectively having three chambers is thus shown schematically with reference to FIG. 2 with which three different treatment media can be separately collected. The skilled person immediately understands how the treatment chamber 1 is to be modified so that four or even more different treatment media can also be separately collected.

It is also possible, as already mentioned further above, that the wafer 2 has the treatment medium 31, 32 applied from both sides and is processed on both sides. This is possible in accordance with FIG. 2a in that an annular rotor 61 is used, wherein a further supply device 70, in addition to the supply device 7 which is above the wafer 2, is arranged beneath the wafer 2 on the oppositely disposed side. A further collection container is preferably provided in this respect for collecting the treatment medium 31, 32 applied to the wafer 2 from below, said further collection container not being shown explicitly in FIG. 2a for reasons of clarity. This means, when an annular rotor 61 is used, it is also possible to apply a treatment medium 31, 32 to the body 2 supported by the annular rotor 61, specifically a wafer 2, for manufacturing microelectronic components, successively or simultaneously from both sides, as is shown by way of example in FIG. 2a with reference to a specific embodiment.

The displacement of the separation element 80 between position A and position B can in this respect be technically realized in any suitable manner. Only some possible technical solutions are outlined by way of example with reference to FIG. 3a and FIG. 3b respectively and to FIG. 4 and FIG. 5. The skilled person immediately understands that other solutions of equal effect are also possible and are also covered by the present invention.

In the example of FIG. 3a and FIG. 3b respectively, which shows a section along the line A-A in accordance with FIG. 3a, an embodiment is shown in which the separation element 80 is driven, for example, by means of a linear motor not shown explicitly. The chamber 81 shown is bounded by the fixed chamber wall 8100 and the chamber 82 is bounded by the fixed chamber wall 8200 in the vertical direction in accordance with the illustration. The connecting rod 84 is arranged between the chamber walls 8100 and 8200, is drivable via the linear motor, not shown, and is connected to the run-off cone 83 such that the separation element 80 together with the run-off cone 83 is displaceable between position A and position B by means of the connecting rod 84.

A similar solution is shown with respect to FIG. 4 in which no connecting rod 84 is provided for displacing the separation element 80, but rather a spindle 85 having an external thread and cooperating with an internal thread which is provided in a borehole 87 of the separation element 80. The spindle 85 is in this respect rotationally fixedly connected to a rotary drive, not shown explicitly, so that the separation element 80 can be pushed into position A by rotating the spindle 85 in one of the two directions and can be pushed into position B by rotating the spindle 85 in the opposite direction.

In accordance with FIG. 5, there is also the possibility of moving the separation element 80 to and fro between position A and position B by means of a bellows 86. If the bellows 86 is exposed to a pressure D, for example, to compressed air under pressure B, the elastic bellows 86 is extended in a manner known per se and the separation element 80 is pushed with the run-off cone 83 upwardly into position A in accordance with the illustration. If the interior of the bellows is again relieved of the pressure D, the bellows previously elastically stretched by the pressure D contracts again back to its position of rest, whereby the separation element 80 is conveyed back into position B.

Finally, another respective complete processing sequence is shown schematically with reference to FIGS. 6a to 6d and to FIGS. 7a to 7d respectively for processing a wafer 2 in a processing apparatus 1 in accordance with the invention.

Figure 6A:
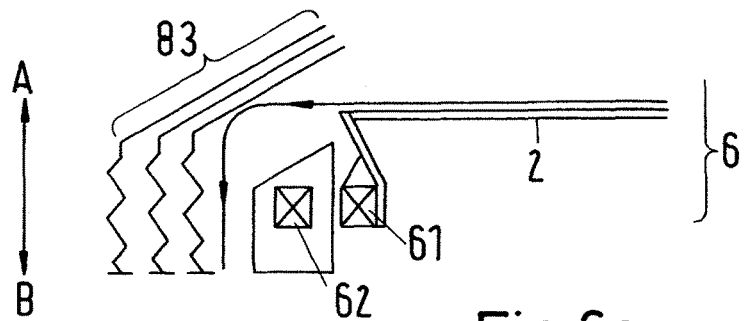
Figure 6B:
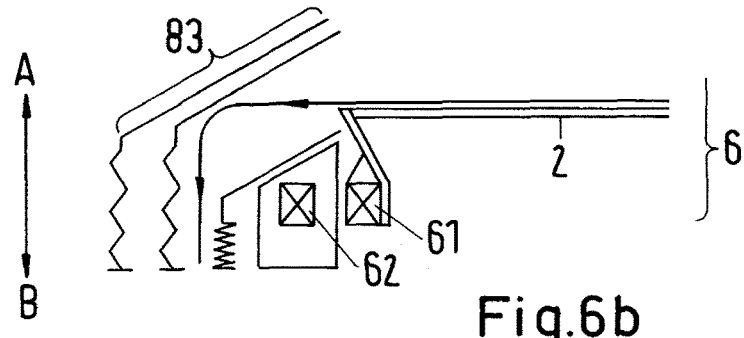
Figure 6C:
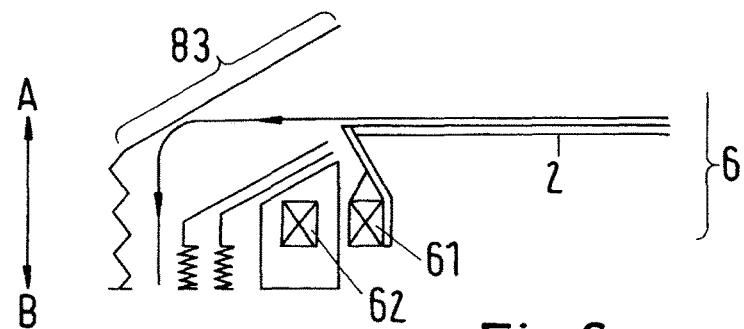
Figure 6D:
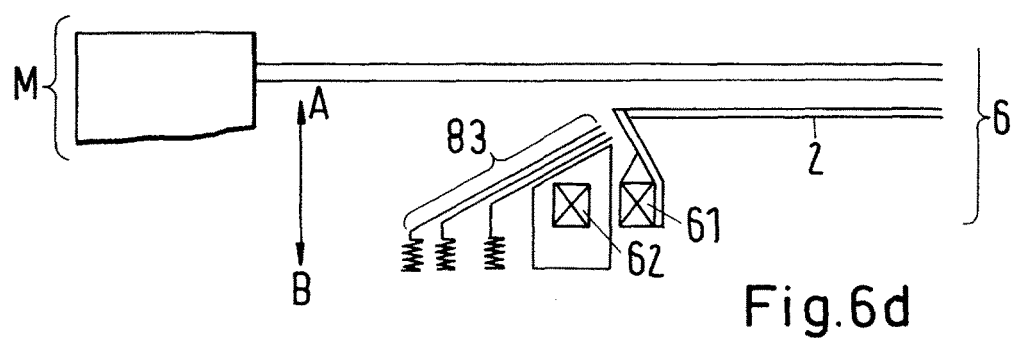
Figure 7A:
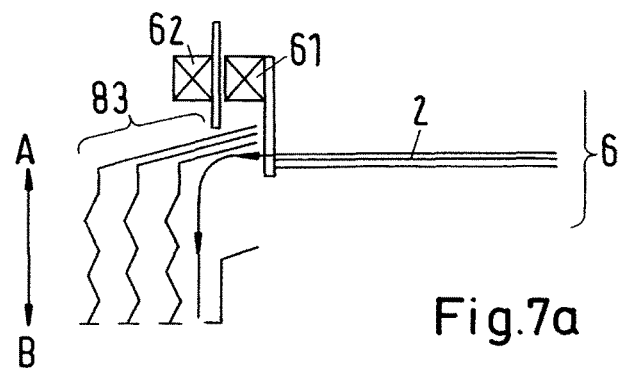
Figure 7B:
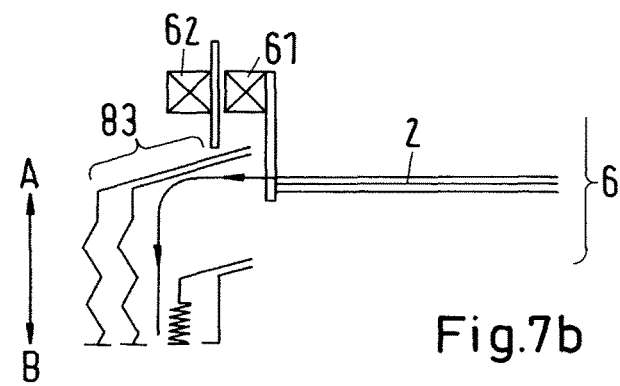

In this respect, the processing sequence of FIG. 6a to FIG. 6b only differs from that of FIG. 7a to FIG. 7b in that in the embodiment of FIG. 6 a processing apparatus is used in which the wafer 2 is arranged in a lying position, that is above the rotor 61 in accordance with the illustration, whereas the wafer 2 in the example of FIG. 7 is arranged suspended, that is beneath the rotor in accordance with the illustration.

In a first processing step (FIGS. 6a and 7a respectively), the wafer 2 is first treated by a first processing medium which is led off into the inner chamber in accordance with the illustration. For this purpose, all the separation elements 80 with the run-off cone 83 are in position A. In accordance with FIG. 6b and FIG. 7b respectively, the innermost separation element 80 with the run-off cone 83 is then displaced into position B so that in a second processing step the second processing medium is led into the center chamber.

Figure 7C:
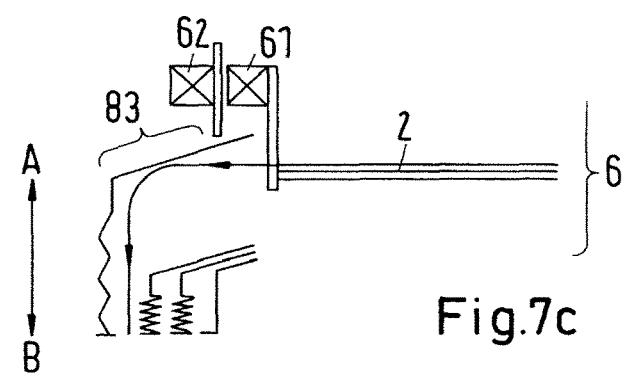

FIG. 6c and FIG. 7c respectively finally show a final third workstep in which the wafer 2 is coated with a third processing medium, e.g. with a lacquer. For this purpose, the two innermost separation elements 80 are in the lower position B so that the third coating medium is led off into the outermost chamber in accordance with the illustration.

Figure 7D:
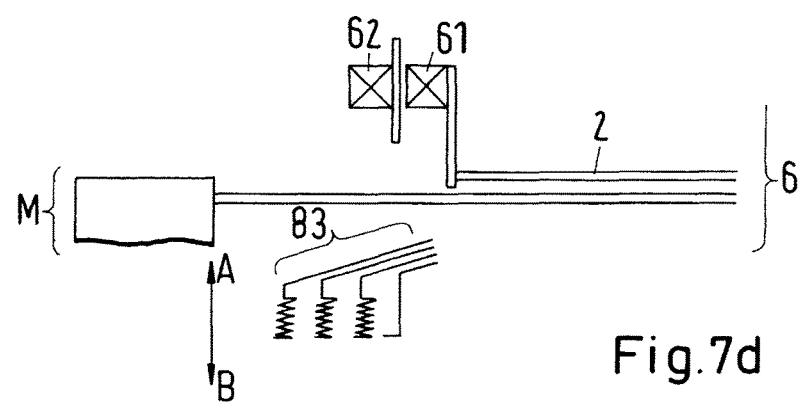

In FIG. 6c and FIG. 7d respectively all the separation elements 80 with the run-off cone 83 are in the lower position B. This allows a robot M automatically to remove the completely processed wafer 2 from the now open process chamber (not shown) and to load the process chamber with a new wafer 2 for a next complete processing sequence.

It is understood that all the above-described embodiments of the invention are only to be understood as examples or by way of example and that the invention in particular, but not only, includes all suitable combinations of the described embodiments.

The invention claimed is:

1. A treatment apparatus for treating a surface of a body with a first treatment medium and a second treatment medium, the apparatus comprising:
   a process chamber;
   a holding device disposed within the process chamber, wherein the holding device is rotatable about an axis of rotation, and wherein the holding device is configured to receive and hold the body within the process chamber;
   a bearingless motor comprising:
      a stator; and
      a rotor, wherein the rotor is magnetically journalled in a bearingless manner with respect to the stator, wherein the rotor is rotationally fixedly coupled to the holding device, and wherein the rotor is disposed within the process chamber;
   a supply device configured to supply the first treatment medium and the second treatment medium to the surface of the body when the body is held in the holding device; and
   a collection container, comprising:
      a plurality of separation elements, wherein each of the separation elements divides the collection container into two chambers, wherein each separation element is movable between a first position and a second position, wherein each separation element is movable independently from each of the other separation elements, wherein, when the apparatus is in use, the first treatment medium is collected in a first one of the chambers when each separation element is at the first position, and the second treatment medium is separately collected in a second one of the chambers when at least one of the separation elements is at the second position; and
      a base chamber part, wherein the base chamber part is not displaceable with respect to the holding device.

* * * * *